(12) United States Patent
Huang et al.

(10) Patent No.: US 7,649,568 B2
(45) Date of Patent: Jan. 19, 2010

(54) IMAGE DATA DECODING METHOD OF IMAGE VERTICAL BLANKING INTERVAL AND A DEVICE THEREOF

(75) Inventors: Yuan-Hao Huang, Hsinchu (TW); Chiuan-Shian Chen, Hsinchu (TW)

(73) Assignee: VXIS Technology Corp., Hsinchu (TW)

( * ) Notice: Subject to any disclaimer, the term of this patent is extended or adjusted under 35 U.S.C. 154(b) by 790 days.

(21) Appl. No.: 11/293,746

(22) Filed: Dec. 2, 2005

(65) Prior Publication Data

US 2006/0125960 A1    Jun. 15, 2006

(30) Foreign Application Priority Data

Dec. 14, 2004    (TW) .............................. 93138664 A

(51) Int. Cl.
*H04N 7/087* (2006.01)
*H03L 7/00* (2006.01)
(52) U.S. Cl. .................. 348/465; 348/536; 348/468; 348/537; 348/572; 348/697
(58) Field of Classification Search .................. 348/465, 348/468, 466, 536, 537, 572, 573, 697, 476, 348/477, 478, 505, 689
See application file for complete search history.

(56) References Cited

U.S. PATENT DOCUMENTS

| 5,657,088 A | 8/1997 | Hankinson ................ 348/465 |
| 7,046,298 B2 * | 5/2006 | Kuzumoto et al. .......... 348/465 |

* cited by examiner

*Primary Examiner*—M. Lee
*Assistant Examiner*—Jean W Désir
(74) *Attorney, Agent, or Firm*—Alan Kamrath; Kamrath & Associates PA

(57) ABSTRACT

An image data decoding method of an image vertical blanking interval (VBI) and device thereof can adjust a run-in clock signal of data lines of teletext to a data phase of teletext data lines. The method can accurately decode data of the teletext data lines to avoid a phase bias and an erroneous decoding result. A main technical method to decode the data of the VBI is to extract the data of the teletext data lines to determine corresponding bit logical values of the image data and then to output a decode result and also output a phase adjustment value. The phase adjustment value is used to adjust a read phase value of the extracted image so as to synchronize a data phase in VBI.

8 Claims, 8 Drawing Sheets

| Bit sampling length | MSB (most significant bit) (D2N-1,...,DN+1,DN,DN-1,...,D2,D1,D0) | Decoded bit data | Output phase adjustment value |
|---|---|---|---|
| 2N | 000...000...000 | 1 | 0 |
| | 000...000...001 | 1 | D0 |
| | 000...000...011 | 1 | D0 |
| | ...... | 1 | D0 |
| | 000...001...111 | \|D2N-1\|≧\|D0\| | (\|D2N-1\|≧\|D0\|)?D0: D2N-1 |
| | 000...011...111 | 0 | D2N-1 |
| | ...... | 0 | D2N-1 |
| | 001...111...111 | 0 | D2N-1 |
| | 011...111...111 | 0 | D2N-1 |
| | 111...111...111 | 0 | 0 |
| | 111...111...110 | 0 | -D0 |
| | 111...111...100 | 0 | -D0 |
| | ...... | 0 | -D0 |
| | 111...110...000 | \|D0\|≧\|D2N-1\| | (\|D0\|≧\|D2N-1\|)?D0: D2N-1 |
| | 111...100...000 | 1 | -D2N-1 |
| | ...... | 1 | -D2N-1 |
| | 110...000...000 | 1 | -D2N-1 |
| | 100...000...000 | 1 | -D2N-1 |

FIG. 9

| Bit sampling length | MSB (most significant bit) (D2N,D2N-1,...,DN+1,DN,DN-1,...,D2,D1,D0) | Decoded bit data | Output phase adjustment value |
|---|---|---|---|
| 2N+1 | 000...000...000 | 1 | 0 |
| | 000...000...001 | 1 | D0 |
| | 000...000...011 | 1 | D0 |
| | ...... | 1 | D0 |
| | 000...001...111 | 1 | D0 |
| | 000...011...111 | 0 | D2N |
| | ....... | 0 | D2N |
| | 001...111...111 | 0 | D2N |
| | 011...111...111 | 0 | D2N |
| | 111...111...111 | 0 | 0 |
| | 111...111...110 | 0 | -D0 |
| | 111...111...100 | 0 | -D0 |
| | ...... | 0 | -D0 |
| | 111...110...000 | 0 | -D0 |
| | 111...100...000 | 1 | -D2N |
| | ...... | 1 | -D2N |
| | 110...000...000 | 1 | -D2N |
| | 100...000...000 | 1 | -D2N |

FIG. 10

IMAGE DATA DECODING METHOD OF IMAGE VERTICAL BLANKING INTERVAL AND A DEVICE THEREOF

BACKGROUND OF THE INVENTION

1. Field of the Invention

The invention relates to an image data decoding method of image vertical blanking interval (VBI) and a device to perform the method and, more particularly, to an image data decoding method for high-frequency teletext image data of the image vertical blanking interval.

2. Description of the Related Art

When processing an image display, VBI (vertical blanking interval) and HBI (horizontal interval) signals are normally reserved without showing. Conventional VBI data types are mainly three types, TeleText, Closed Caption (CC), and Wide Screen Signal (WSS). With reference to FIG. 5, every data line of the teletext-type VBI data includes a 2-byte run-in clock signal and a 43-byte data string. With reference to FIG. 6, every data line of the CC-type or WSS-type data includes a 1-byte run-in clock signal and a 2-byte data string.

When processing the VBI data, the VIII data has to be decoded in advance. A decoding method for the teletext-type data is more complicated, because the run-in clock signal of the teletext includes a higher frequency than that of the CC or WSS, and, also, the data volume of the teletext is larger than that of the CC or WSS.

With reference to FIG. 7, a teletext decoder uses a closed phase locked loop (PLL) circuit to lock the run-in clock signal. The closed phase locked loop circuit separates the teletext data lines through a run-in clock signal separator to accurately read the data of the teletext data lines.

Although the described closed phase locked loop circuit is beneficial to adjust different phases of the data in the teletext data lines, the run-in clock signal of the teletext data lines is only a small part of the data, which does not occur frequently. Moreover, the closed phase locked loop needs to take quite some time to be able to accurately lock the run-in clock signal. Since digital data of the teletext data lines is not continuous, a phase error when decoding the teletext data lines can easily occur by using the closed phase locked loop method to track data over a long term.

With reference to FIG. 8, U.S. Pat. No. 5,657,088 entitled "System and method for extracting caption teletext information from a video signal" uses a threshold value to determine logical values of the data. When the input digital image data exceeds a setup turning point, the logical value is determined to be 1 or 0. On the other hand, when the input digital image data is lower than the setup turning point, the logical value is determined to be 0 or 1.

Further, a delay time can be set for the current input digital image data, so the digital input data can be determined to be beyond or below a turning point to complete decoding the digital image data. The decoding method in this patent is rather simple and can save space in a layout area of image processing chips. However, the turning point is not easy to change, which tends to cause an erroneous decoding result when the image processing chips process image signals in an inferior signal environment.

SUMMARY OF THE INVENTION

An image data decoding method of an image vertical blanking interval (VBI) and device thereof of the present invention is provided, which can adjust a run-in clock signal of data lines of teletext to correspond to a data phase of the data lines of the teletext. Hence, the present invention can accurately decode data of the data lines of the teletext to avoid a phase bias and an erroneous decoding result.

To achieve the above-described objective, a main technical method to decode the data of the VBI of the present invention is to extract the data of the teletext data lines to determine corresponding bit logical values of the image data and then to output a decode result and also to output a phase adjustment value. The phase adjustment value is used to adjust a read phase value of the extracted image to so as to synchronize a data phase in VBI. Therefore, the present invention can achieve the objective to accurately acquire the data of the teletext data lines without the closed phase locked loop (PLL) or a direct digital frequency synthesizer (DDFS).

BRIEF DESCRIPTION OF THE DRAWING

FIG. 9 is a look-up table for bit sampling lengths of 2N in accordance with the present invention.

FIG. 10 is a look-up table for bit sampling lengths of 2N+1 in accordance with the present invention.

DETAILED DESCRIPTION OF THE INVENTION

Figure 1:
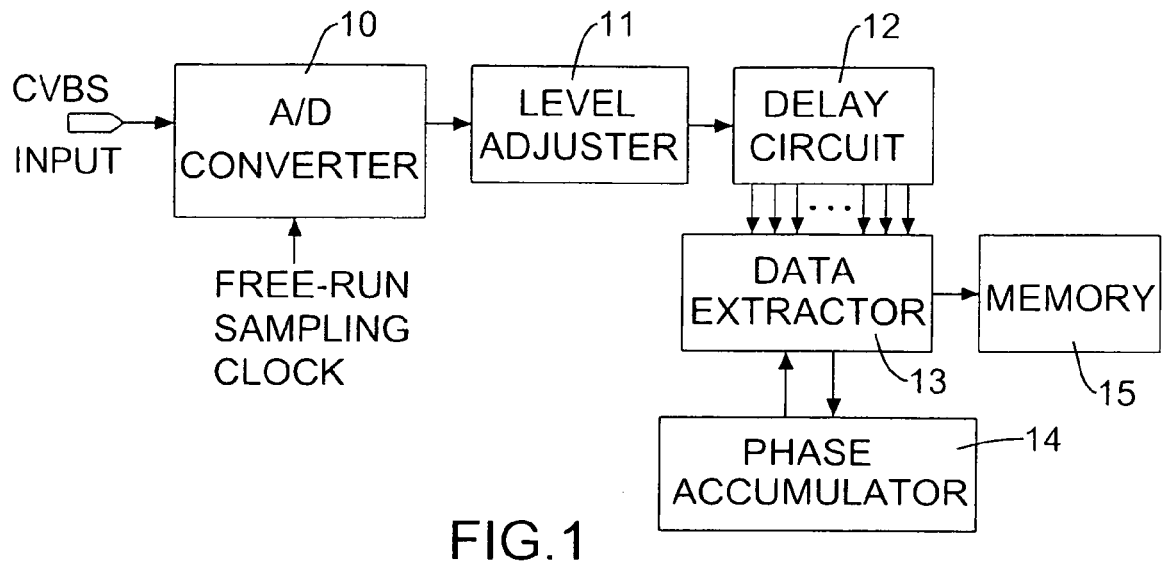
FIG. 1 is a block diagram of a preferred embodiment of a device to perform an image data decoding method of image vertical blanking interval in accordance with the present invention.

With reference to FIG. 1, a preferred embodiment of an image data decoding device for an image vertical blanking interval (VBI) in accordance with the present invention includes an analog-to-digital converter (ADC) (10), a level adjuster (11), a delay circuit (12), a data extractor (13), a phase accumulator (14) and a memory (15).

The ADC (10) follows a sampling clock signal to sample and digitize an analog image signal and then to output the digitized image signal. The level adjuster (11) is coupled to an output terminal of the ADC (10) to remove a blanking level and a signal carrier of the analog image signal to convert the digitized image signal to an AC (alternating current) signal.

Figure 2:
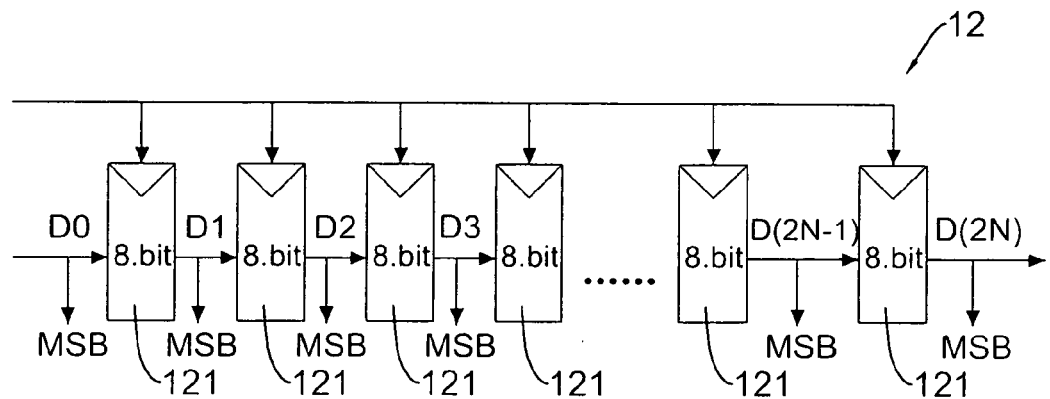
FIG. 2 is a circuit diagram of an example of a preferred embodiment of a delay circuit of the device in FIG. 1.

With further reference to FIG. 2, the delay circuit (12) comprises multiple registers (121). The delay circuit (12) is coupled to an output terminal of the level adjuster (11) for storing digital data of a teletext data line that is regulated by the level adjuster (11). The data extractor (13) is coupled to output terminals of the delay circuit (12) to read a logical value of a most significant bit (MSB) of the digital data of the delay circuit (12) with a specific sampling clock signal, then, to determine a data bit according to every logical value of the MSB, and to output a phase adjustment value.

The phase accumulator (14) is coupled to an output terminal of the data extractor (13) to adjust an accumulated phase based on the phase adjustment value outputted by the data extractor (13) and to feedback to the data extractor (13) to compose a closed circuit with the data extractor (13) to reduce a phase error. The memory (15) is connected to the data extractor (13) for storing the decoded bit data (i.e. the VBI) according to every logical value of the MSB.

Figure 3:
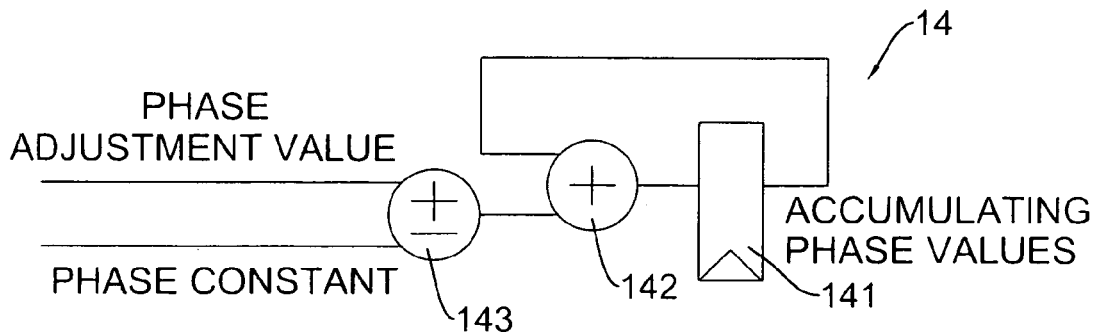
FIG. 3 is a circuit diagram of an example of a preferred embodiment of a phase accumulator of the device in FIG. 1.

With further reference to FIG. 3, the phase accumulator (14) includes a register (141), an adder (142) and an adder/substractor (143) that also can be a second adder. The register (141) is coupled to its own output terminal and an output terminal of the adder/substractor (143) by the adder (142) to compose an accumulation structure. Phase adjustment steps follow. A first input terminal of the adder/substractor (143) receives the phase adjustment value of the data extractor (13), and a second input terminal of the adder/substractor (143) receives a phase constant for a phase accumulation. In this way, the output terminal of the register (141) can acquire a continuous adjusted accumulated phase.

An image data decoding method for an image vertical blanking interval. (VBI) of the present invention includes steps of converting an input analog image signal to a digital image signal according to a specific sampling timing signal, removing a blanking level of the digital image signal and a DC (direct current) level of a signal carrier by the level adjuster (11), storing the digital data in the delay circuit (12) and extracting the MSB data from the registers (121) of the delay circuit (12) by the data extractor (13) to determine its logical values. Thereby, multiple sample points can be acquired. If the specific sampling clock signal makes a bit data signal including 2N+1 sample points, then, the delay circuit (12) includes at least 2N+1 registers (121).

Since the data extractor (13) is used to extract the output data of the delay circuit (12) to decode and determine the bit logical value of the extracted data with the logical value of the most significant bit (MSB) of the registers (121), the sampling clock signal for the data extractor (13) must be synchronous with the input signal to ensure an accuracy of a judgment on bit logical values. Thereby, the data extractor (13) decodes the MSB logical value and outputs a corresponding phase adjustment value to the phase accumulator (14). When the phase accumulator (14) accumulates to phases of 0° and 180°, a strobe signal is output to the data extractor (13) to make the data extractor (13) adjust the phase of the decoded data bit.

According to the foregoing phase adjustment steps, the data extractor (13) first reads the sampled bit data that is temporarily stored in the delay circuit (12). The valid bit data is determined by the temporarily stored MSB logical values of multiple sample points. When all of the sample points are determined with the logical values, the logical values of the bit data are then acquired.

An example of a determination method follows. Simultaneously, the data extractor (13) determines the phase adjustment values by the logical values of the sample points and outputs to the phase accumulator (14). The phase accumulator (14) can adjust the phases according to the phase adjustment values and also feedback the strobe signal to the data extractor (13) when reaching some specific phases. Hence, the data extractor (13) and the phase accumulator (14) form a closed circuit so the data extractor (13) provides the phase adjustment values according to the latest input image signal, and the phase accumulator (14) will dynamically adjust the accumulated phase value to make the data extractor (13) correctly extract the sample points from the delay circuit (12) according to the phase adjustment values.

Figure 4:
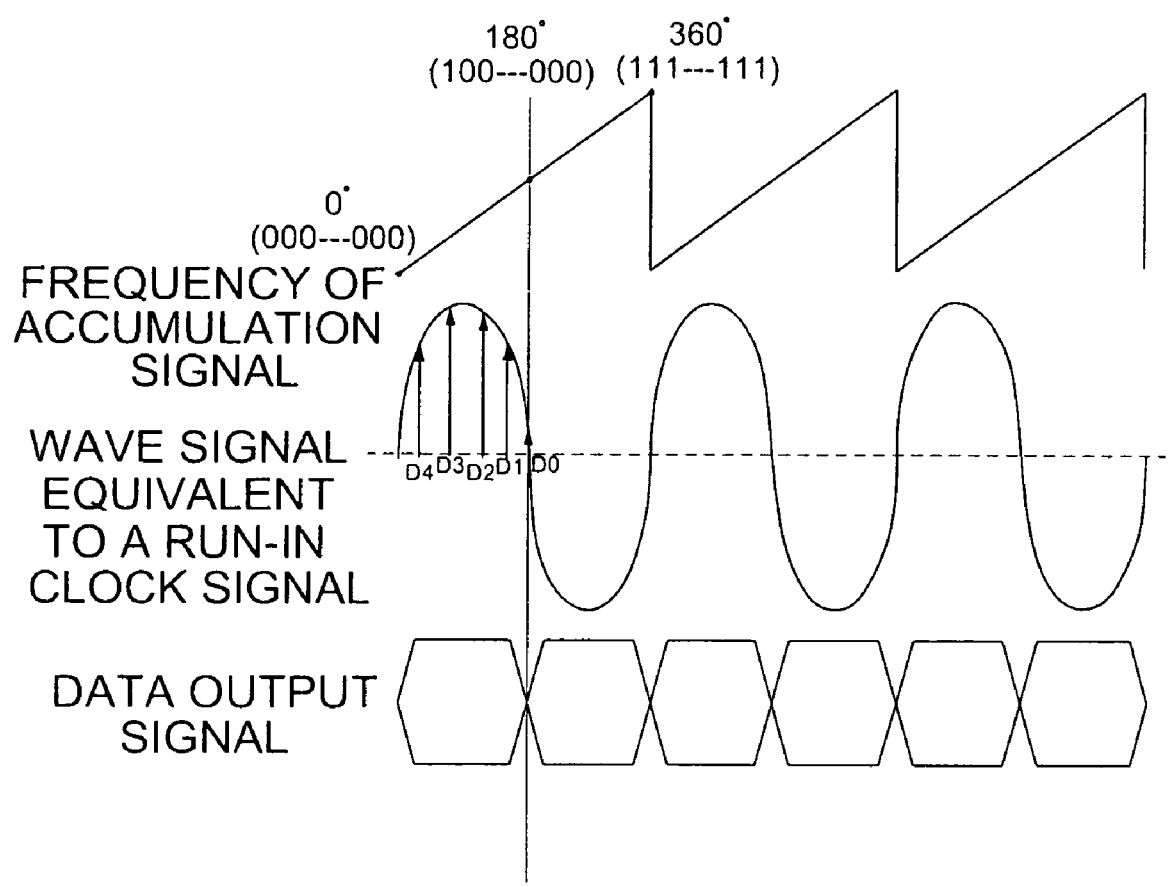
FIG. 4 shows a timing diagram of a frequency of a phase accumulation signal of the phase accumulator, a wave signal equivalent to a run-in clock signal and a data output signal of the data extractor.
Figure 5:
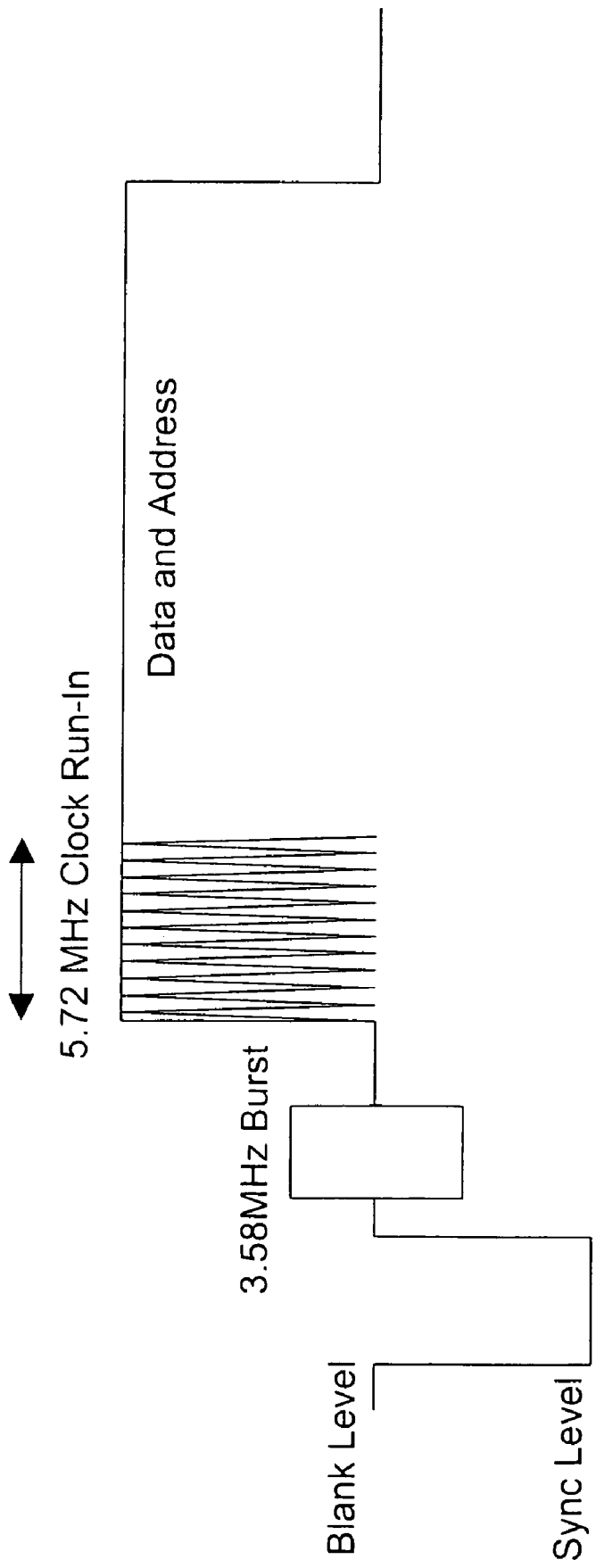
FIG. 5 is a diagram of a conventional teletext-type VBI data line in accordance with the prior art.
Figure 6:
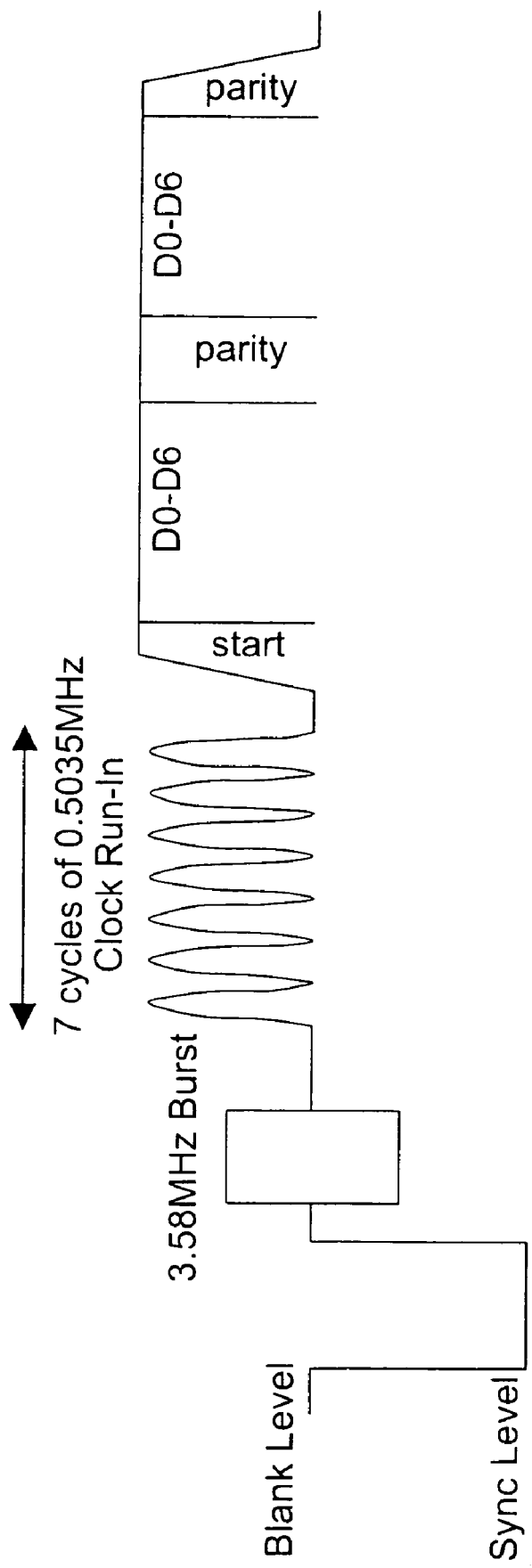
FIG. 6 is a diagram of either a conventional close caption (CC) data line or a wide screen signal (WSS) data line in accordance with the prior art.
Figure 7:
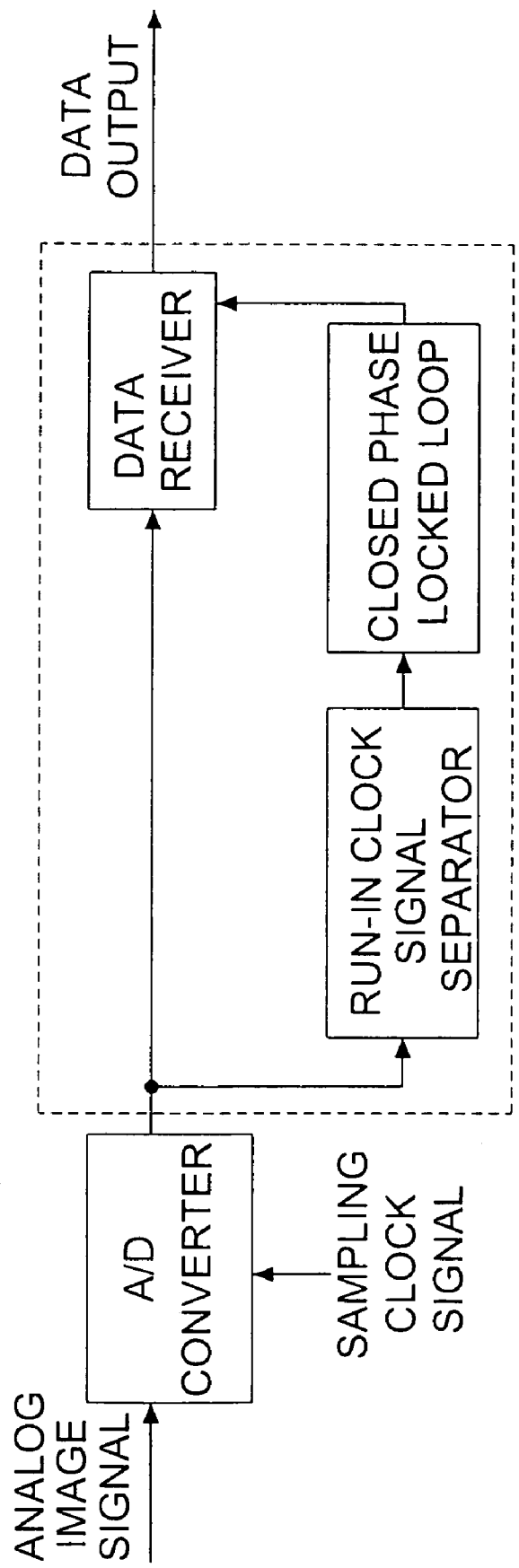
FIG. 7 is a block diagram of a conventional decoder for a teletext-type VBI data line in accordance with the prior art.
Figure 8:
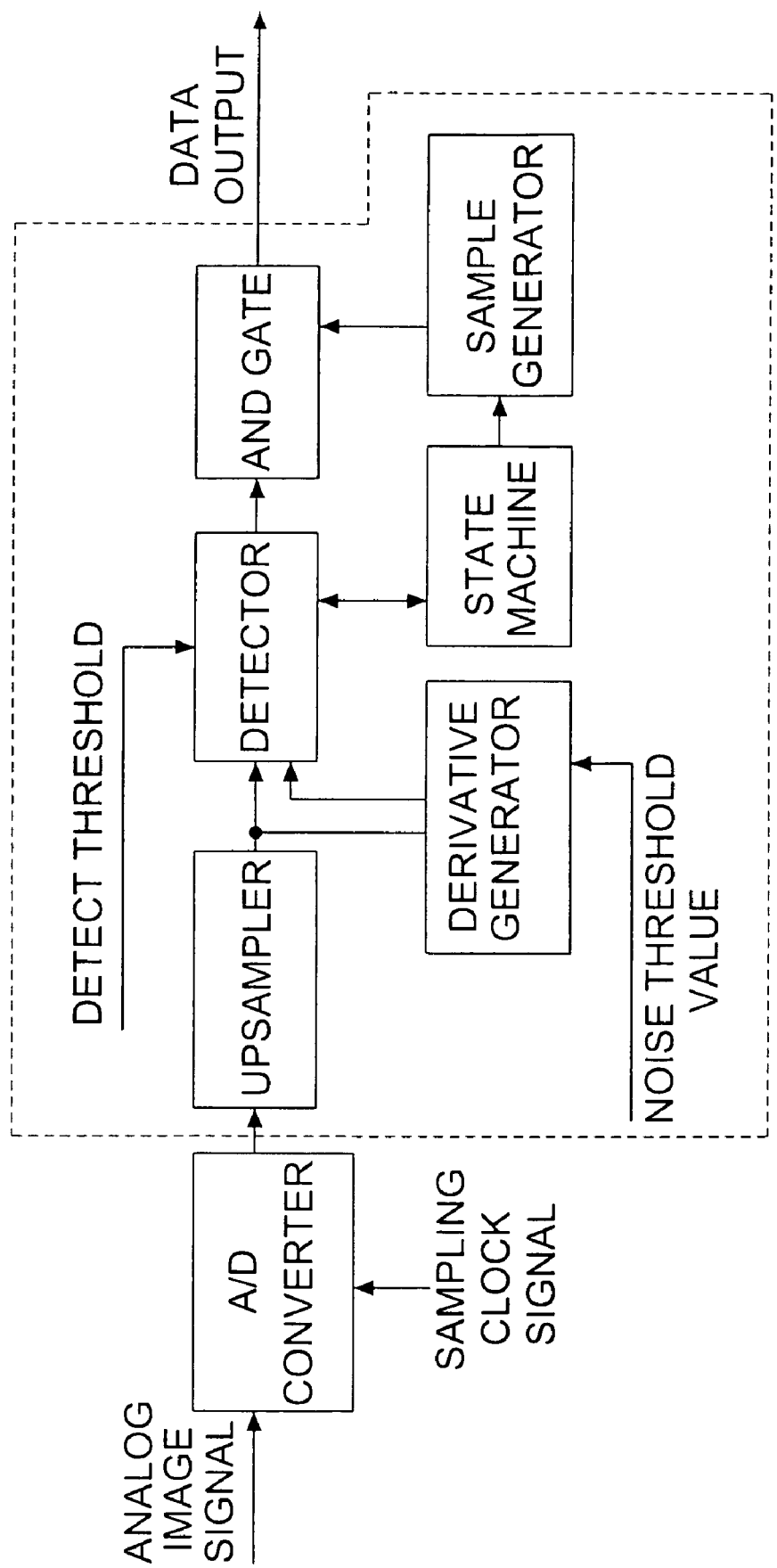
FIG. 8 is a block diagram of a preferred embodiment of U.S. Pat. No. 5,657,088 entitled "System and method for extracting caption teletext information from a video signal."

With further reference to FIG. 4, when the phase accumulator (14) determines the phase equals 180°, a 180°-phase signal is output to the data extractor (13). Then, the data extractor (13) adjusts the phases of the sampling clock signal extracted from the registers (121) of the delay circuit (12). Similarly, when the phase accumulator (14) determines the phase equals 360°, which means a cycle ends, the phase accumulator (14) also repeats the aforesaid operation. When the data extractor (13) extracts one row of temporarily stored sample points in the delay circuit (12), whether the logical values of the sample points are 1 or 0 are determined. Therefore, the blanking signal contained in the image vertical blanking interval (VIII) can be successfully decoded and output to the memory (15).

An actual implementation method of the data extractor (13) is easily achieved by setting up a look-up table. The look-up table includes the most significant bit extracted from every register (121) in the delay circuit (12), phase adjustment values and decoded bit data. The input image data may be changed. Hence, when the data extractor (13) performs sampling, the bit sampling length may be different. With reference to FIGS. 9 and 10, the look-up tables show bit sampling lengths of 2N and 2N+1 respectively, as an example.

The look-up tables show that when the data extractor (13) determines a decoded bit data, a corresponding phase adjustment value is also generated and sent to the phase accumulator (14) to adjust the accumulated phase. The data extractor (13) extracting positive half cycle bit data of the corresponding input image signal negative bit data should have been extracted indicates the phase is not synchronous. Thus, the accumulated phase can be adjusted to make the data extractor (13) adjust the extracted sampling clock signal of the next row of bit data. Moreover since the input image data may include noise data, if the data extractor extracts an opposite logical value to a sequence of continuous 1 or continuous 0, the opposite logical value can be determined to be the noise data and ignored.

To conclude, the image data decoding method of the present invention performs a digitizing sampling on an input image signal and converts the digitized image signal into an AC (alternating current) signal. The values of the positive half cycle and the negative half cycle of the AC signal being significantly different provides the basis for the data extractor to determine the decoded bit data and the phase adjustment value. The data extractor and the phase accumulator compose a feedback closed circuit so that the phase of the sampling clock signal of the data extractor can be adjusted to output accurate decoded bit data. Therefore, the present invention can achieve the objective to accurately acquire the data of the teletext data lines without the closed phase locked loop (PLL) or a direct digital frequency synthesizer (DDFS).

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. An image data decoding method of an image vertical blanking interval (VBI) comprising:
performing a digitizing sampling on an input image signal;
converting the digitized image signal into an AC (alternating current) signal by removing a blanking level of the digital image signal and a DC (direct current) level of a signal carrier;
extracting logical values of every bit data of one row of the image data to determine the corresponding bit logical values of the image data and then to output a decoded result and also output a phase adjustment value; and using the phase adjustment value to adjust a read phase value of the extracted image so as to synchronize a data phase in VBI.

2. An image data decoding device of an image vertical blanking interval (VBI) comprising:

an analog-to-digital converter (ADC) following a sampling clock signal to sample and digitize an analog image signal and then to output the digitized image signal;

a level adjuster connected to an output terminal of the ADC to remove a blanking level and a signal carrier of the digital image signal, so as to convert the signal to an AC (alternating current) signal without a DC (direct current) level;

a delay circuit coupled to an output terminal of the level adjuster for storing digital data of a teletext data line, which is regulated by the level adjuster;

a data extractor coupled to an output terminal of the delay circuit for determining the data of the delay circuit and extracting the data of the VBI and then outputting a phase adjustment value;

a phase accumulator coupled to an output terminal of the data extractor to adjust an accumulated phase with the phase adjustment value output by the data extractor and to feedback to the data extractor to compose a closed circuit with the data extractor, to reduce phase error; and a memory coupled to the data extractor for storing the decoded bit data.

3. The image data decoding device of a vertical blanking interval (VBI) as claimed in claim 2, wherein the data extractor is configured with a look-up table.

4. The image data decoding device of a vertical blanking interval (VBI) as claimed in claim 2, wherein the look-up table comprises multiple sample points output by the delay circuit, output bit data in accordance with logical values of the bit data and phase adjustment values which output to the phase accumulator.

5. The image data decoding device of a vertical blanking interval (VBI) as claimed in claim 2, wherein the delay circuit comprises multiple registers.

6. The image data decoding device of a vertical blanking interval (VBI) as claimed in claim 3, wherein the delay circuit comprises multiple registers.

7. The image data decoding device of a vertical blanking interval (VBI) as claimed in claim 5, wherein the phase accumulator comprises a register and an adder, wherein the register is coupled to its own output terminal by the adder to compose an accumulation structure, wherein the adder receives the phase adjustment value of the data extractor to change an accumulation output status of the phase accumulator.

8. The image data decoding device of a vertical blanking interval (VBI) as claimed in claim 6, wherein the phase accumulator further comprises a register and an adder, wherein the register is coupled to its own output terminal by the adder to compose an accumulation structure, wherein the adder receives the phase adjustment value of the data extractor to change an accumulation output status of the phase accumulator.

* * * * *